(12) United States Patent
Collard et al.

(10) Patent No.: US 6,576,973 B2
(45) Date of Patent: Jun. 10, 2003

(54) SCHOTTKY DIODE ON A SILICON CARBIDE SUBSTRATE

(75) Inventors: Emmanuel Collard, Tours (FR); André Lhorte, Saint Avertin (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/747,781

(22) Filed: Dec. 22, 2000

(65) Prior Publication Data

US 2001/0054715 A1 Dec. 27, 2001

(30) Foreign Application Priority Data

Dec. 24, 1999 (FR) .............................. 99 16490

(51) Int. Cl.$^7$ ...................... H01L 29/872; H01L 29/161
(52) U.S. Cl. ...................... 257/483; 257/485; 257/484; 257/77; 257/576; 438/576
(58) Field of Search ............................... 257/483, 484, 257/77, 485; 438/576

(56) References Cited

U.S. PATENT DOCUMENTS

| 3,742,317 A | * | 6/1973 | Shao ........................ 257/483 |
| 3,849,789 A | | 11/1974 | Cordes et al. |
| 5,449,925 A | | 9/1995 | Baliga et al. |
| 5,635,412 A | | 6/1997 | Baliga et al. |
| 5,789,311 A | | 8/1998 | Ueno et al. |
| 5,914,500 A | | 6/1999 | Bakowski et al. |
| 5,967,795 A | * | 10/1999 | Bakowsky ................. 438/494 |

FOREIGN PATENT DOCUMENTS

EP 0 093 866 A2 11/1983

OTHER PUBLICATIONS

French Search Report from application No. 9916490, filed Dec. 24, 1999.

* cited by examiner

Primary Examiner—Jerome Jackson
(74) Attorney, Agent, or Firm—Wolf, Greenfield & Sacks, P.C.; James H. Morris; Gary S. Engelson

(57) ABSTRACT

A vertical Schottky diode including an N-type silicon carbide layer of low doping level formed by epitaxy on a silicon carbide substrate of high doping level. The periphery of the active area of the diode is coated with a P-type epitaxial silicon carbide layer. A trench crosses the P-type epitaxial layer and penetrates into at least a portion of the height of the N-type epitaxial layer beyond the periphery of the active area. The doping level of the P-type epitaxial layer is chosen so that, for the maximum voltage that the diode is likely to be subjected to, the equipotential surfaces corresponding to approximately ¼ to ¾ of the maximum voltage extend up to the trench.

13 Claims, 1 Drawing Sheet

SCHOTTKY DIODE ON A SILICON CARBIDE SUBSTRATE

BACKGROUND OF THE INVENTION

1. Field of the Invention

The present invention relates to the forming of a Schottky diode.

2. Discussion of the Related Art

In the field of semiconductor components, the material which is currently mainly used is silicon. For very high breakdown voltages, silicon carbide is a priori preferable since silicon carbide can provide breakdown voltages per thickness unit approximately 10 times greater than silicon.

However, in the present state of technology, the methods currently used for the manufacturing of silicon-based components cannot be used for the manufacturing of components based on silicon carbide (SiC). In particular, it is presently impossible, in practice, to perform implantations and diffusions of P-type dopants into N-type doped silicon carbide, noting that the P-type dopant currently used for silicon carbide is aluminum and the N-type dopant is nitrogen. Indeed, a diffusion anneal for a P-type dopant would require temperatures on the order of 1700° C., which raises acute technological problems.

The elementary structure of a Schottky diode is illustrated in FIG. 1. This diode is formed from a heavily-doped N-type substrate 1 on which is formed an N-type epitaxial layer 2 properly doped to have the desired Schottky threshold. On this epitaxial N layer is deposited silicon oxide 3 defining a window in which the Schottky contact is desired to be established by means of an appropriate metallization 4. The rear surface of the component is coated with a metallization 5.

Such a structure has a very poor breakdown voltage. Indeed, the equipotential surfaces tend to curve up to rise back to the surface, which results, especially in the curved areas of the equipotential surfaces, in very strong field variations that limit the possible reverse breakdown voltage. To avoid this disadvantage, the structure shown in FIG. 2, in which a peripheral P-type ring 6 is formed at the periphery of the Schottky diode area, is conventionally used in the field of silicon-based components. As a result, the equipotential surfaces must pass in volume under the P regions and thus have a less pronounced curvature. This considerably improves the voltage withstand of the diode. As an example, with silicon of a doping level of $10^{16}$ at./cm$^3$, a voltage withstand on the order of 10 V will be obtained with no guard ring and a breakdown voltage on the order of 50 V will be obtained with a guard ring.

However, as previously indicated, such a P-type guard ring cannot be made in a structure formed on a silicon carbide substrate. In this case, the simple structure illustrated in FIG. 1 is not desirable either for the same reasons as in the case of a silicon substrate.

SUMMARY OF THE INVENTION

Thus, the present invention aims at providing a Schottky diode structure compatible with simple silicon carbide manufacturing methods and that provides a relatively high breakdown voltage.

To achieve these and other objects, the present invention provides a vertical Schottky diode including an N-type silicon carbide layer of low doping level formed by epitaxy on a silicon carbide substrate of high doping level, in which the periphery of the active area of the diode is coated with a P-type epitaxial silicon carbide layer; a trench crosses the P-type epitaxial layer and penetrates into at least a portion of the height of the N-type epitaxial layer beyond the periphery of the active area; the doping level of the P-type epitaxial layer is chosen so that, for the maximum voltage that the diode is likely to be subjected to, the equipotential surfaces corresponding to approximately ¼ to ¾ of the maximum voltage extend up to the trench.

According to an embodiment of the present invention, the doping level of the P-type epitaxial layer is slightly greater than the doping level of the N-type epitaxial layer.

According to an embodiment of the present invention, the distance between the external periphery of the active area and the internal periphery of the trench is on the order of 30 to 60 µm.

The present invention also provides a method for manufacturing a vertical Schottky diode on a heavily-doped N-type silicon carbide substrate, including the steps of forming a lightly-doped N-type epitaxial layer; forming a P-type epitaxial layer; digging a peripheral trench; depositing an insulating layer; forming a central opening crossing the insulating layer, the P-type epitaxial layer and the N-type epitaxial layer; and depositing a metal capable of forming a Schottky barrier with the N-type epitaxial layer.

According to an embodiment of the present invention, the doping level of the P-type epitaxial layer is chosen so that, for the maximum voltage that the diode is likely to be subjected to, the equipotential surfaces corresponding to approximately ¼ to ¾ of the maximum voltage extend to the trench.

The foregoing objects, features and advantages of the present invention will be discussed in detail in the following non-limiting description of specific embodiments in connection with the accompanying drawings.

DETAILED DESCRIPTION

As usual in the field of semiconductor representation, the various layers of the various drawings are to scale neither in their horizontal dimensions, nor in their vertical dimensions.

Figure 1:
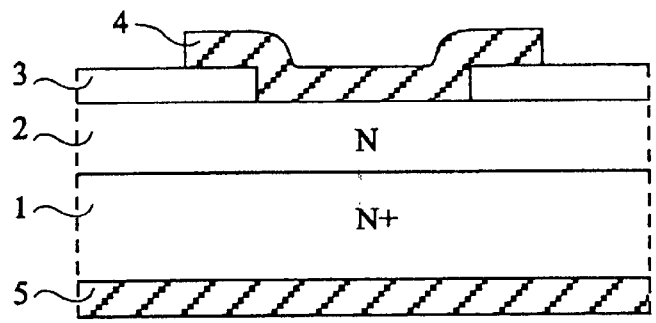
FIG. 1 is a simplified cross-section view of an elementary Schottky diode.
Figure 2:
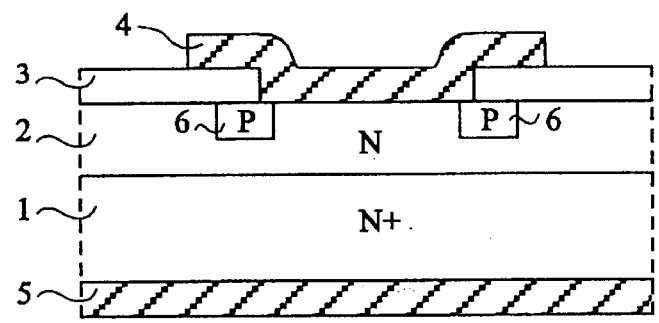
FIG. 2 is a simplified cross-section view of a conventional Schottky diode on a silicon substrate.
Figure 3:
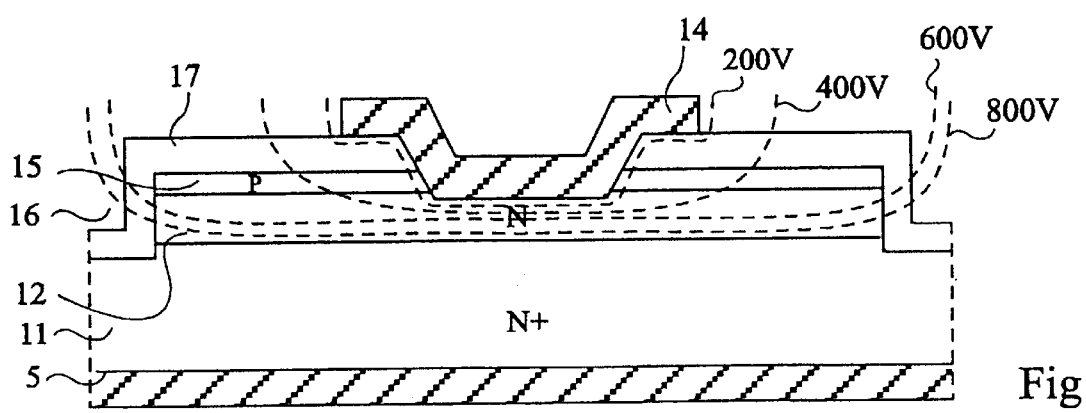
FIG. 3 is a simplified cross-section view of a Schottky diode on a silicon carbide substrate according to the present invention.

The Schottky diode of FIG. 3 is formed from a heavily-doped N-type silicon carbide wafer 11. The N-type dopant is, for example, nitrogen. On wafer 11 is formed a thin more lightly-doped N-type epitaxial layer 12. For a desired breakdown voltage on the order of 600 to 1000 V, this epitaxial layer will have a thickness on the order of 3 to 6 µm. The Schottky contact is formed between this layer 12 and a metallization 14, for example, a platinum, titanium, or nickel silicide or the like. The rear surface of wafer 11 is coated with a metallization 5 corresponding to the diode cathode.

According to the present invention, before depositing metallization 14, the following steps are successively carried out:

forming a thin P-type doped silicon carbide epitaxial layer 15, the dopant being for example aluminum, forming a peripheral trench 16 substantially having the depth of the sum of the thicknesses of epitaxial layers 12 and 15, depositing a layer of a protection insulator 17, for example silicon oxide, and forming a central opening in which is formed the Schottky metal layer 14, which is thus in contact with N layer 12 and which biases P layer 15.

The distance between the Schottky contact periphery and the trench is on the order of 30 to 60 μm, for example 40 μm.

The doping of P-type region 15 is chosen so that, when a voltage close to the maximum reverse breakdown voltage by the diode is applied thereto, the equipotential surfaces, instead of rising back to the surface, extend at least partially to the area of trench 16. It is, for example, desired to obtain that, when the maximum reverse voltage is applied, the equipotential surface corresponding to a value between ¼ and ¾ of the maximum voltage reaches the trench. By avoiding that the equipotential surfaces are too close together and have curvatures that are too pronounced, the existence of areas where the fields are too strong in the component or in the insulator surrounding is avoided. An almost ideal solution is illustrated by the equipotential surfaces shown in dotted lines in FIG. 3. For a diode having a breakdown voltage from 800 to 1000 V, four equipotential surfaces corresponding to four equally distributed values of the potential, for example values close to 200, 400, 600, and 800 V, have been shown. It should be noted that the equipotential surface substantially corresponding to 600 V reaches the trench.

The way in which the field lines are distributed will essentially depend on the doping level of the P-type epitaxial layer, which may however be very thin and have a thickness on the order of 1 to 3 μm.

Those skilled in the art will know how to choose the optimal doping level of the P-type epitaxial layer, especially according to the desired breakdown voltage and to the doping and the thickness of the N-type epitaxial layer, by using known simulation methods, for example by using the ISE-DESSIS simulation program.

More specifically, the applied reverse voltage being on the order of 800 V, for an N-type epitaxy of a thickness from 3 to 6 μm, for a P-type epitaxy of a thickness on the order of 1 to 3 μm, and for a trench substantially extending to the bottom of the N-type epitaxy, the applicant has shown that the following results are obtained:

1) for an N-type epitaxy of $6.10^{15}$ at./cm$^3$ and a P-type epitaxy of $5.10^{15}$ at./cm$^3$, all the equipotential surfaces curve up to the surface, including the 800-V equipotential surface, before reaching the trench;

2) for an N-type epitaxy of $10^{16}$ at./cm$^3$ and a P-type epitaxy of $5.10^{16}$ at./cm$^3$, part of the equipotential surfaces, starting from the 600-V equipotential surface, reach the trench;

3) for an N-type epitaxy of $10^{16}$ at./cm$^3$ and a P-type epitaxy of $10^{18}$ at./cm$^3$, all equipotential surfaces reach the trench, none rising up to the surface.

According to the present invention, a structure corresponding to the second case is preferred. Indeed, if all equipotential surfaces rise back up to the surface and if all equipotential surfaces reach the trench, the insulator deposited at the surface (currently silicon oxide) must have a particularly good breakdown voltage, that is, it must be deposited with particularly strong quality constraints to be able to resist the intense transverse fields applied thereto.

It may be deduced from the above examples that to be in the second case, the doping of the P-type layer must be slightly greater than the doping of the N-type layer, for example from 2 to 10 times greater.

Of course, the present invention is likely to have various alterations, modifications, and improvements which will readily occur to those skilled in the art, in particular as concerns the sizing of the various layers, vertically as well as horizontally.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical Schottky diode including an N-type silicon carbide layer of low doping level formed by epitaxy on a silicon carbide substrate of high doping level, wherein:

a periphery of an active area of the Schottky diode is coated with a P-type epitaxial silicon carbide layer;

a trench extends through the P-type epitaxial layer and the N-type epitaxial layer to the substrate beyond the periphery of the active area;

a doping level of the P-type epitaxial layer is chosen so that, for a maximum voltage that the diode is likely to be subjected to, equipotential surfaces corresponding to approximately ¼ to ¾ of the maximum voltage extend to the trench.

2. The Schottky diode of claim 1, wherein the doping level of the P-type epitaxial layer is slightly greater than the doping level of the N-type epitaxial layer.

3. The Schottky diode of claim 1, wherein a distance between an external periphery of the active area and an internal periphery of the trench is on the order of 30 to 60 μm.

4. A method for manufacturing a vertical Schottky diode on a heavily-doped N-type silicon carbide substrate, including the steps of:

forming a lightly-doped N-type epitaxial layer;

forming a P-type epitaxial layer;

digging a peripheral trench extending through the N-type epitaxial layer and the P-type epitaxial layer to the substrate;

depositing an insulating layer;

forming a central opening crossing the insulating layer, the P-type epitaxial layer and reaching the N-type epitaxial layer; and depositing a metal capable of forming a Schottky barrier with the N-type epitaxial layer.

5. The method of claim 4, wherein a doping level of the P-type epitaxial layer is chosen so that, for a maximum voltage that the diode is likely to be subjected to, equipotential surfaces corresponding to approximately ¼ to ¾ of the maximum voltage extend to the peripheral trench.

6. A semiconductor structure, comprising:

a silicon carbide substrate;

a first epitaxial layer of a first conductivity type that contacts a surface of the substrate;

a second epitaxial layer of a second conductivity type that contacts a surface of the first layer, the first epitaxial layer and second epitaxial layer covering less than the surface of the substrate; and a metallization that contacts the first epitaxial layer.

7. The structure of claim 6, wherein the structure is a diode.

8. The structure of claim 7, wherein the structure is a Schottky diode.

9. The structure of claim 6, wherein the metallization contacts the first epitaxial layer through an opening in the second epitaxial layer.

10. The structure of claim 6, wherein the first epitaxial layer has a first periphery, the second epitaxial layer has a second periphery, and the first epitaxial layer and the second epitaxial layer are coterminous at the first periphery and the second periphery.

11. A method of forming a Schottky diode on a silicon carbide substrate, comprising:

epitaxially growing a first layer of a material of a first conductivity type on the substrate;

epitaxially growing a second layer of a material of a second conductivity type on the first layer;

forming a trench that extends through the first layer and the second layer to the substrate at a periphery of the diode;

forming a first opening in the second layer; and forming a metallization within the first opening.

12. The method of claim 10, wherein the material of a first conductivity type is N doped silicon carbide.

13. The method of claim 10, wherein the material of the second conductivity type is P doped silicon carbide.

* * * * *